United States Patent
Bloom (10) Patent No.: US 6,904,574 B1
(45) Date of Patent: Jun. 7, 2005

(54) METHOD AND APPARATUS FOR AUTOMATICALLY ELIMINATING INFERRED LATCHES

(75) Inventor: Andrew M. Bloom, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 344 days.

(21) Appl. No.: 10/241,116

(22) Filed: Sep. 10, 2002

(51) Int. Cl.⁷ .............................................. G06F 17/50
(52) U.S. Cl. ................................................ 716/3; 716/2
(58) Field of Search .................. 716/1–18; 717/140–142

(56) References Cited

U.S. PATENT DOCUMENTS

| | | | |
|---|---|---|---|
| 6,295,636 B1 * | 9/2001 | Dupenloup | 716/18 |
| 6,571,375 B1 * | 5/2003 | Narain et al. | 716/5 |
| 6,609,229 B1 * | 8/2003 | Ly et al. | 716/4 |
| 2003/0023941 A1 * | 1/2003 | Wang et al. | 716/4 |
| 2003/0037305 A1 * | 2/2003 | Chen et al. | 716/4 |

* cited by examiner

Primary Examiner—Stacy A. Whitmore
Assistant Examiner—Binh Tat
(74) Attorney, Agent, or Firm—W. Eric Webostad (57) ABSTRACT

Method and apparatus for automatically eliminating inferred latches created by hardware design language (HDL) source code is described. A node tree is built from the HDL source code based on the HDL's Language Reference Manual. The node tree is scanned to identify one or more conditional logic constructs that are sources for creation of inferred latches. A modified node tree is generated by automatically adding and/or modifying sub-productions of the conditional language constructs that create the inferred latches.

24 Claims, 8 Drawing Sheets

| | if-statement code | case-statement code | loop-statement code | Result |
|---|---|---|---|---|
| Example 1 | if A then<br>  B <= 1;<br>end if; | case A is<br>  when 1 => B <= 1;<br>  others =><br>end case; | while A loop<br>  B <= 1;<br>end loop; | Vcc ——— B |
| Example 2 | if A then<br>  B <= 1;<br>else<br>  B <= 0;<br>end if; | case A is<br>  when 1 => B <= 1;<br>  others => B <= 0;<br>end case; | while A loop<br>  B <= 1;<br>end loop;<br>B <= 0; |  |
| Example 3 | if Q then<br>  B <= A;<br>end if; | case Q is<br>  when 1 => B <= A;<br>  others =><br>end case; | while Q loop<br>  B <= A;<br>end loop; |  |
| Example 4 | if Q then<br>  B <= A;<br>else if R then<br>  B <= 1;<br>end if; | case (Q, R) is<br>  when "11""10"=> B <= A;<br>  when "01"=> B <= 1;<br>  others =><br>end case; | while (Q or R) loop<br>  if Q then B <= A;<br>  else B <= 1;<br>  end if;<br>end loop; |  |
| Example 5 | if A and A'event then<br>  B <= A;<br>end if; | N/A | N/A |  |

NODE=architecture_body
architecture_name=ARCH
entity_name=ENT
NODE=architecture_statement_part
　NODE=concurrent_statement
　　NODE=process_statement
　　　NODE=sensitivity_list
　　　　signal_name=A
　　　　signal_name=B
　　　NODE=process_statement_part
　　　　NODE=sequential_statement
　　　　　NODE=if_statement
　　　　　　if_has_else=FALSE
　　　　　　NODE=condition
　　　　　　　NODE=expression
　　　　　　　　NODE=relation
　　　　　　　　　NODE=shift_expression
　　　　　　　　　　NODE=simple_expression
　　　　　　　　　　　NODE=term
　　　　　　　　　　　　NODE=factor
　　　　　　　　　　　　　NODE=primary
　　　　　　　　　　　　　　NODE=name
　　　　　　　　　　　　　　　value=A
　　　　　　　　　NODE=relational_operator
　　　　　　　　　　value="="
　　　　　　　　　NODE=shift_expression
　　　　　　　　　　NODE=simple_expression
　　　　　　　　　　　NODE=term
　　　　　　　　　　　　NODE=factor
　　　　　　　　　　　　　NODE=primary
　　　　　　　　　　　　　　NODE=literal
　　　　　　　　　　　　　　　value='1'
　　　　　　NODE=sequence_of_statements
　　　　　　　NODE=sequential_statement
　　　　　　　　NODE=signal_assignment_statement
　　　　　　　　　NODE=target
　　　　　　　　　　value=C
　　　　　　　　　NODE=waveform
　　　　　　　　　　NODE=waveform_element
　　　　　　　　　　　NODE=expression
　　　　　　　　　　　　value=B

802 {
**    NODE=if_statement
      if_has_else=TRUE
   NODE=condition
    NODE=expression
     NODE=relation
      NODE=shift_expression
       NODE=simple_expression
        NODE=term
         NODE=factor
          NODE=primary
           NODE=name
            value=A
      NODE=relational_operator
       value="="
      NODE=shift_expression
       NODE=simple_expression
        NODE=term
         NODE=factor
          NODE=primary
           NODE=literal
            value='1'
NODE=sequence_of_statements
 NODE=sequential_statement
  NODE=signal_assignment_statement
   NODE=target
    value=C
   NODE=waveform
    NODE=waveform_element
     NODE=expression
      value=B

804 {
**  NODE=sequential_statement
**   NODE=signal_assignment_statement
**    NODE=target
     value=C**
**    NODE=waveform
**     NODE=wageform_element
**      NODE=expression
       value='0'**

FIG. 8

METHOD AND APPARATUS FOR AUTOMATICALLY ELIMINATING INFERRED LATCHES

FIELD OF THE INVENTION

The present invention generally relates to the field of Hardware Description Languages (HDL) and, more particularly, to a method and apparatus for automatically eliminating inferred latches.

BACKGROUND OF THE INVENTION

Hardware Description Languages (HDLs), such as the Very high speed integrated circuit Hardware Description Language (VHDL) or Verilog, are text-based approaches to digital logic design through behavioral and/or structural description of design elements. HDL can be used to design: (1) a programmable logic device (PLD), such as a field programmable gate array (FPGA) or complex programmable logic device (CPLD); (2) a mask programmable device, such as a hardwired pin grid array (PGA), application-specific standard product (ASSP) or application specific integrated circuit (ASIC); (3) a system formed from selected electronic hardware components; or (4) any other electronic device. The HDL-based design methodology requires the user to describe the behavior of a system, which can then be simulated to determine whether the design will function as desired. The design is then synthesized to create a logical network list ("netlist") that can be implemented within a particular device.

Hardware designers currently develop designs and the respective test benches by hand. Designers simulate their designs with the test benches to make sure the design functions as intended. Next, the design is realized via a synthesis process, and a post-synthesis implementation netlist is exported that includes the functional description and timing information for the hardware. During the testing and synthesis process, the designer is looking for potential design errors and problems. The designer is also looking for ways to improve performance (e.g., speed) and reduce costs (e.g., device area).

With many HDLS, when conditional logic is not completely filled out, synthesis of the HDL code will produce a latch. Such latches are commonly referred to as inferred or implied latches. Inexperienced designers will often code conditional logic that results in inferred latches. Such unintentional inferred latches result in slower, possibly incorrect hardware designs. In addition, inferred latches cause the design to take more hardware area than the design would without the extra inferred latches. As such, inferred latches typically baffle novice designers until they determine the root cause.

Experienced designers on the other hand, may intentionally code inferred lathes when using if-then statements, for example, but may unintentionally code inferred latches for other structures, such as case statements, for example. Also, in large case statements having many assignments for each case, designers can easily overlook a single assignment for a particular signal, resulting in an unintentional inferred latch. Depending on the sophistication and depth of the test bench, even the experienced designer may not detect the unintentional latches.

The traditional way to avoid inferred latches is to verify the design with the test bench. The designer simulates the design by taking the HDL source code and the test bench into a simulator. To detect inferred latches, the designer needs to fully understand the manner in which HDL should act, and needs to code extensive test benches that still can easily overlook inferred latch problems.

Accordingly, it would be both desirable and useful to provide method and apparatus for automatically eliminating inferred latches created by HDL code.

SUMMARY OF THE INVENTION

Method, apparatus, and computer readable medium for automatically eliminating inferred latches created by hardware design language (HDL) source code is provided in accordance with one or more aspects of the present invention. A node tree is built from the HDL source code. The node tree is scanned to identify one or more conditional logic productions (CLPs) that are sources for the inferred latches. For example, CLPs can comprise the productions defined in the HDL's Language Reference Manual for if-statement, case-statement, and loop-statement conditional language constructs. A modified node tree is generated by performing at least one of adding and modifying sub-productions of the one or more CLPS.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

DETAILED DESCRIPTION OF THE DRAWINGS

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

The present invention is a method, apparatus, and computer readable medium for eliminating inferred latches created by hardware description language (HDL) source code. Although the description and examples herein make specific reference to the Very high speed integrated circuit Hardware Description Language (VHDL), those skilled in the art will appreciate that the present invention can be used with any HDL, such as, for example, Verilog.

Figure 1:
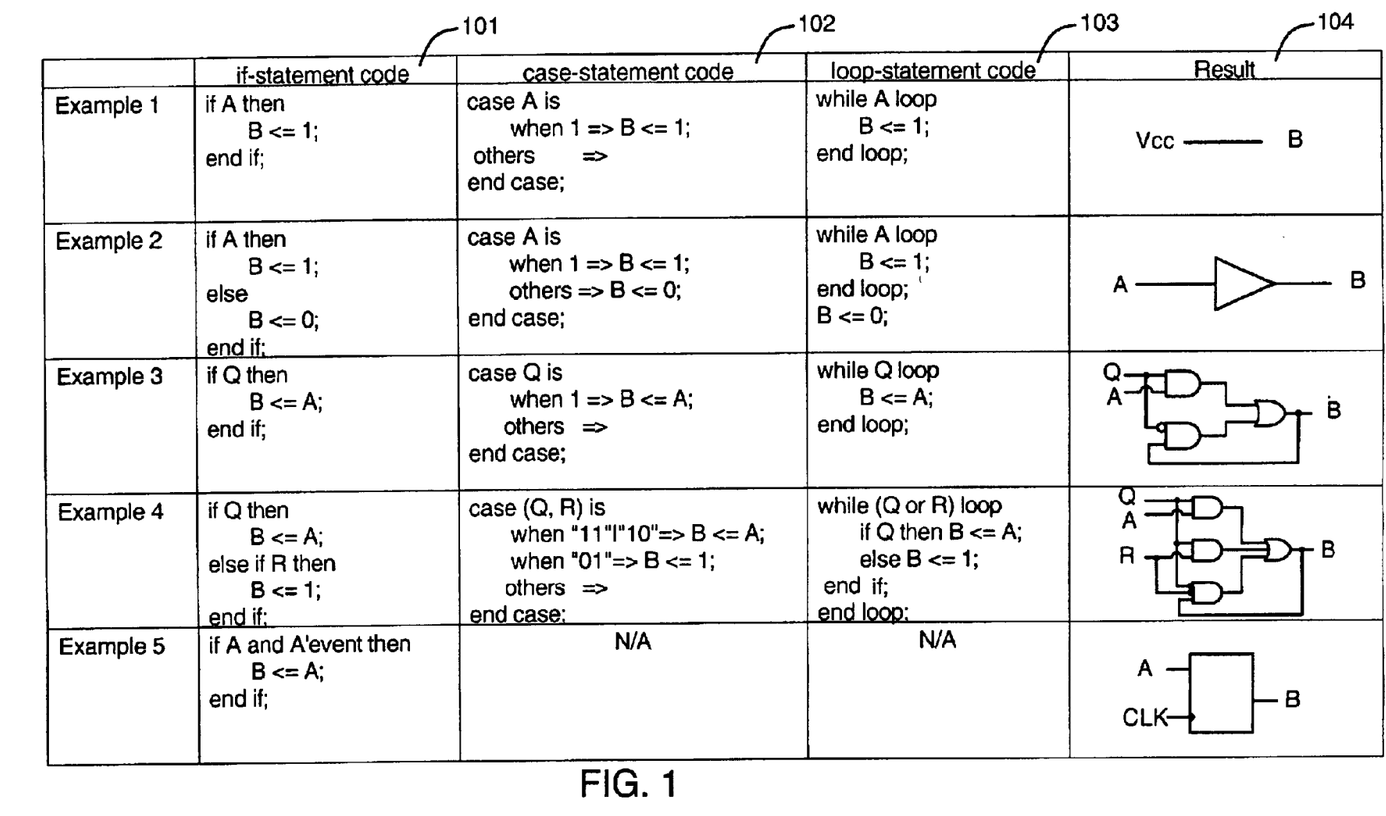
FIG. 1 illustrates a table showing several examples of HDL code and the resulting hardware produced by the code.

In order to better understand the present invention, examples of HDL source code that create inferred latches will now be described. Inferred latches are created by incomplete conditional logic constructs within the HDL source code. In VHDL, conditional logic constructs include if-then-else-statements, case-statements, and loop-statements. FIG. 1 illustrates a table showing several examples of VHDL code and the resulting hardware produced by the code. In Example 1, a signal B is assigned in an if-statement code 101 having no corresponding "else" portion. The corresponding case-statement code 102 and loop-statement code 103 is also shown. Since the value of signal B is not specified if signal A is not true, this conditional logic code results in an inferred latch. In this example, synthesis of the VHDL code may result in the direct assignment of signal B to a value set within the if-statement (e.g., logical 1) after optimization. That is, synthesis may cause signal B to be shorted to Vcc (i.e., always high). While test bench tools use initial values for signals, synthesis tools typically ignore such initial values, resulting in the signal short. In Example 1, the code drafter may not have intended to realize a latch or a short to Vcc.

Example 2 shows a possible intended result of the conditional logic of Example 1 along with the modified source code. In Example 2, the if-statement code 101 includes an "else" portion, and the signal B is assigned a default value within the "else" portion. Synthesis of this code results in a buffered equation, rather than an inferred latch. The case-statement code 102 and loop-statement code 103 is also shown suitably modified to obviate the creation of an inferred latch. In particular, the case-statement includes an "others" portion where signal B is assigned a default value. Signal B is assigned a default value after the loop-statement.

Example 3 shows another instance where an inferred latch is created by conditional logic code. In this example, signal B is assigned the value of signal A if signal Q is true. This code does not specify the value of signal B if Q is false, thus an inferred latch is created. If signal Q is false, the hardware retains the value of signal A. This example results when the code drafter forgets to consider the case where signal Q is false.

Example 4 shows another instance where an inferred latch is created by conditional logic code. In Example 4, signal B is assigned the value of signal A if signal Q is true, and signal B is assigned the value of logical "1" if signal R is true. The code does not specify the value of signal B if both Q and R are false, thus an inferred latch is created. If both signal Q and signal R are false, the hardware retains the value of signal A. Such compound if-then-else-if-statements frequently result in the creation of unintentional inferred latches.

Finally, Example 5 shows an instance where an inferred latch is intentionally created by conditional logic code. In Example 5, a clock is implemented such that when the clock signal is high, signal B is assigned the value of signal A. Signal B is latched when the clock is low. In this example, case-statement code 102 and loop-statement code 103 equivalents are possible, but they are not usually in synthesizable code and are thus not shown.

Figure 2:
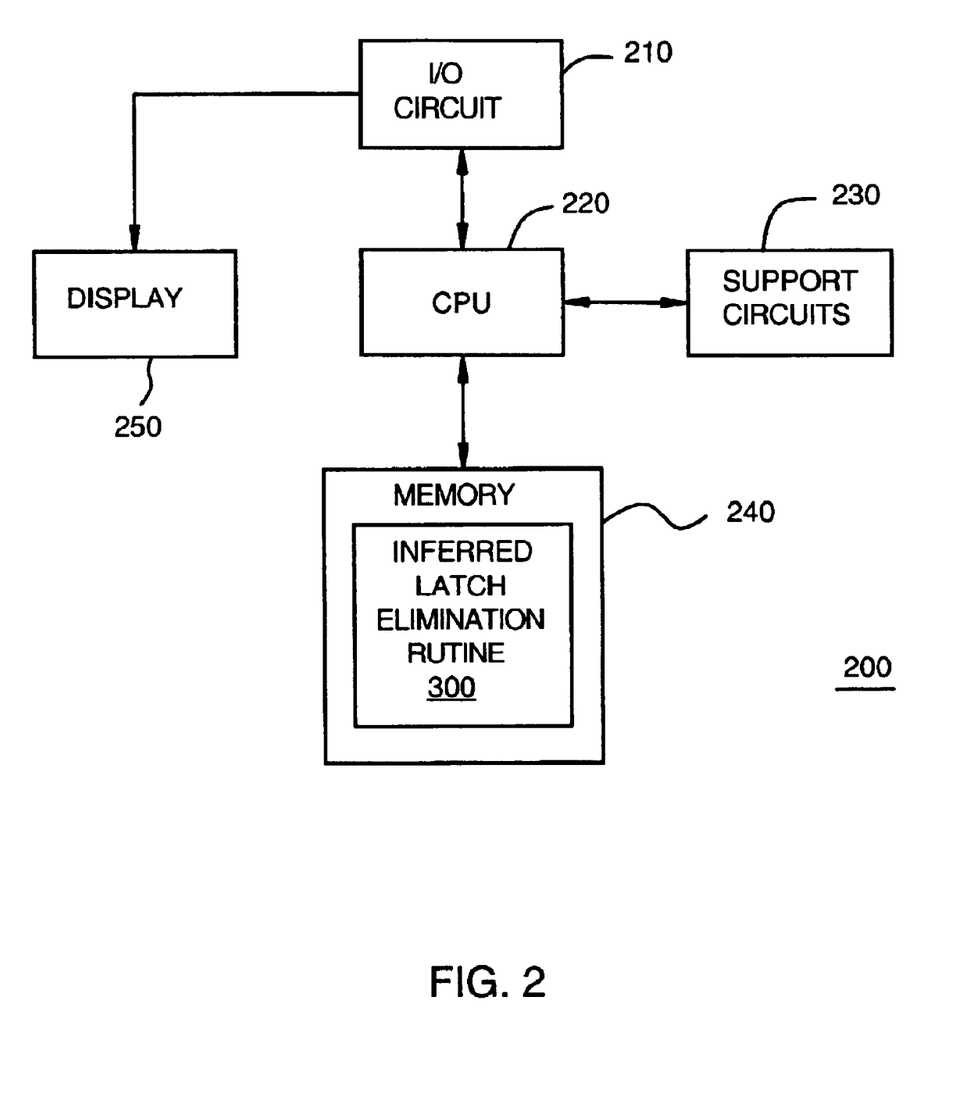
FIG. 2 depicts a high-level block diagram of a general-purpose computer suitable for implementing processes and methods in accordance with one or more aspects of the present invention.

FIG. 2 depicts a high-level block diagram of a general-purpose computer 200 suitable for implementing processes and methods according to the present invention. The general-purpose computer 200 comprises a central processing unit (CPU) 220, a memory device 240, a variety of support circuits 230, an input/output (I/O) circuit 210, and a display 250. The CPU 220 can be any type of processor such as a PENTIUM 4 manufactured by Intel Corporation or a POWERPC manufactured by Motorola, Inc. The support circuitry 230 for the CPU 220 includes conventional cache, power supplies, clock circuits, data registers, I/O interfaces and the like. The I/O circuit 210 may, in addition to display 250, be coupled to a conventional keyboard, mouse, printer and interface circuitry adapted to receive and transmit data, such as data files and the like. The memory device 240 comprises read/write random access memory (RAM), read only memory (ROM), hard disk storage, floppy disk storage, compact disk storage, or any combination of these and similar storage devices. The display 250 is a monitor or like type display device known in the art.

The memory device 240 stores the program or programs (e.g., inferred latch elimination routine 300) that are executed to implement the methods of the present invention. Although the invention has been disclosed as being implemented as an executable software program, those skilled in the art will understand that the invention may be implemented in hardware, software, or a combination of hardware and software. Such implementations may include a number of processors independently executing various programs and dedicated hardware such as application specific integrated circuits (ASICs).

Figure 3:
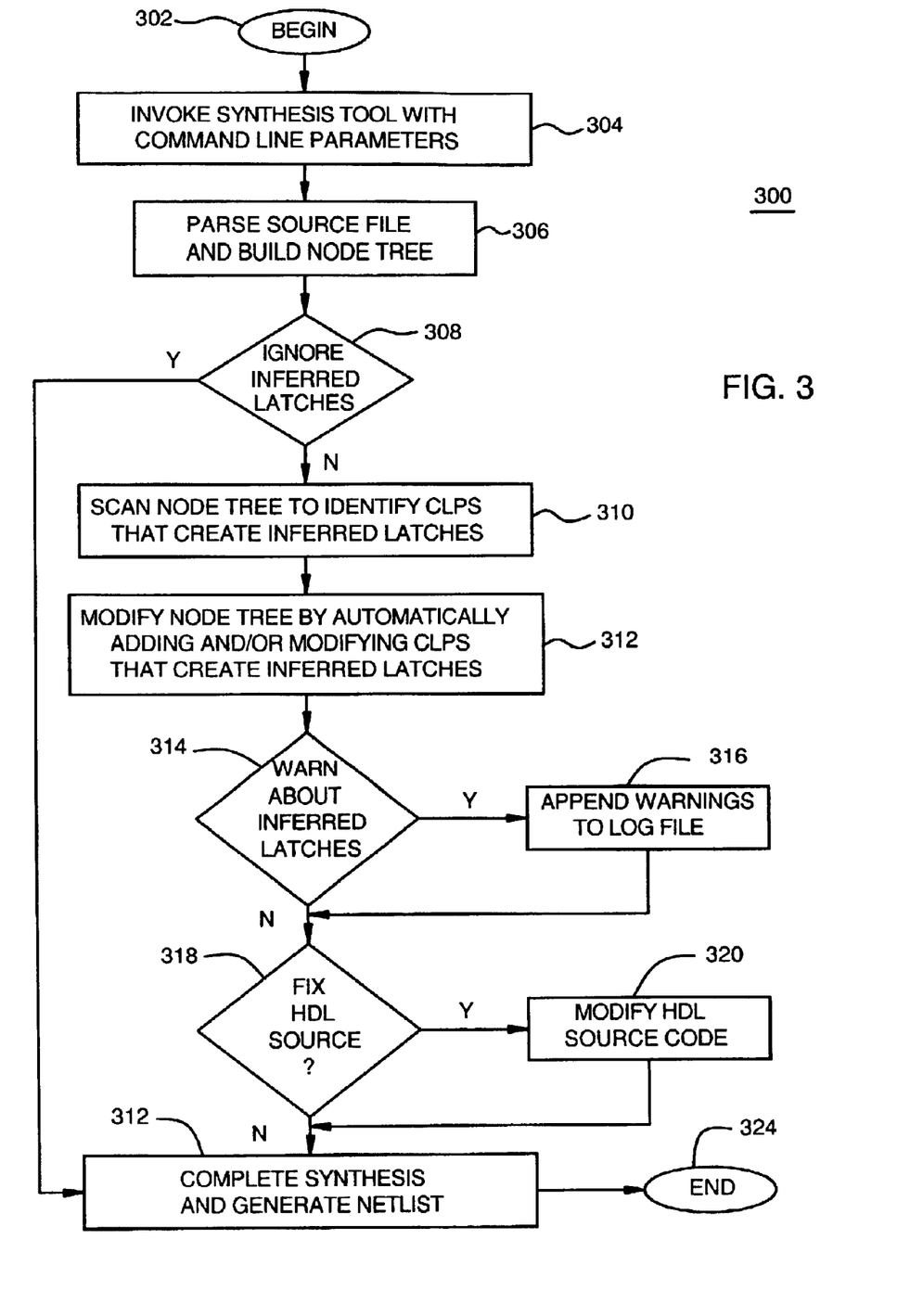
FIG. 3 depicts a flow diagram showing an exemplary embodiment of a synthesis process for automatically eliminating inferred latches created by HDL source code in accordance with one or more aspects of the present invention.

FIG. 3 depicts a flow diagram showing an exemplary embodiment of an inferred latch synthesis process 300 for automatically eliminating inferred latches created by HDL source code. The process 300 of the present invention can be implemented as a stand-alone program, or as part of a synthesis program. Synthesis process 300 begins at step 302, and proceeds to step 304. At step 304, the synthesis tool is invoked with command line parameters. The synthesis tool comprises software that compiles HDL source code to generate a netlist for hardware realization.

Figure 7:
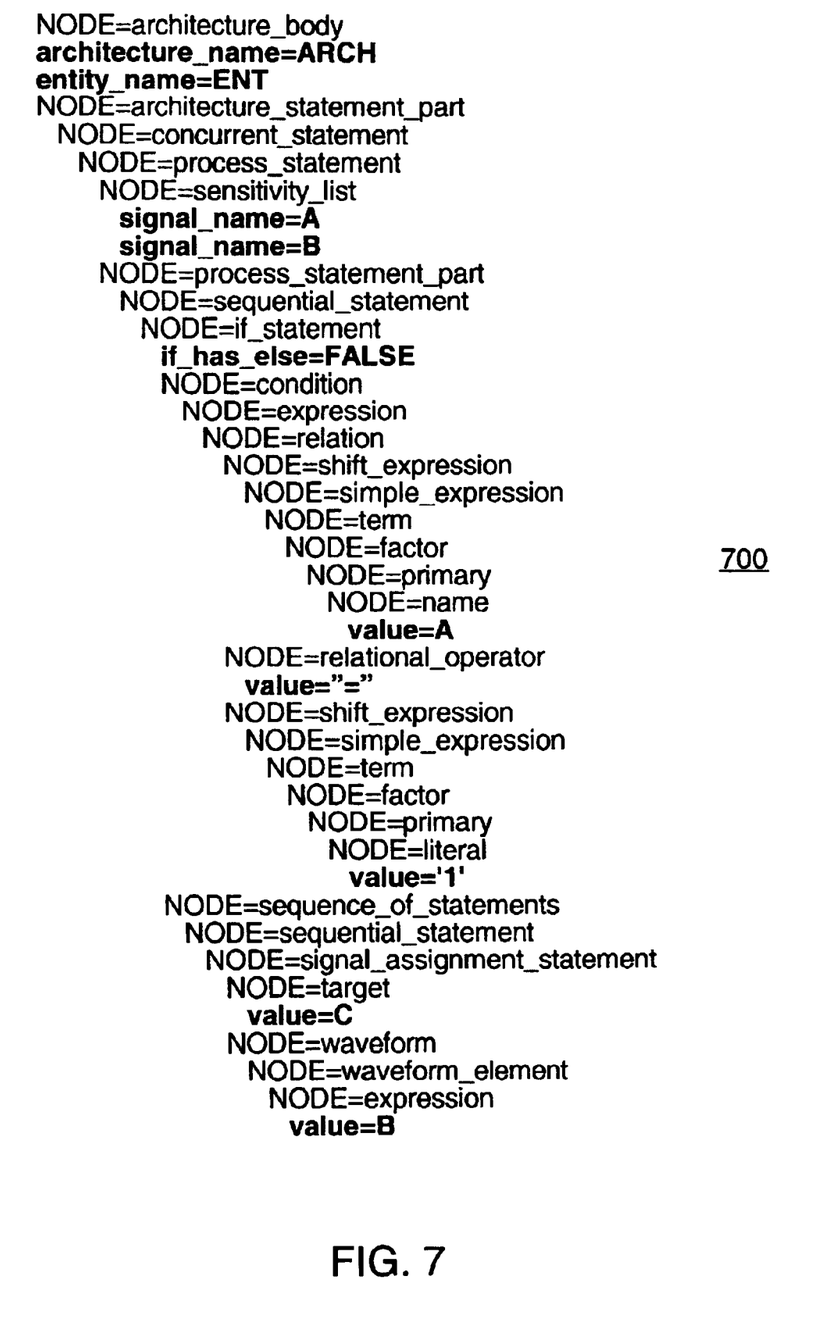
FIG. 7 illustrates an exemplary embodiment of a node tree generated from HDL source code in accordance with one or more aspects of the present invention having an inferred latch.

At step 306, the HDL source file is parsed, and a node tree is constructed. The node tree is a hierarchical tree of nodes based on the productions of a respective HDL's Language Reference Manual. An example of a node tree is shown in FIG. 7. At step 308, a determination is made as to whether or not the presence of inferred latches is to be ignored. For example, command line parameters of step 304 can be used to indicate whether or not to ignore inferred latches. Alternatively, command line parameters may be used to specify which type of inferred latches to ignore (e.g., ignore inferred latches generated by if-then conditional logic, but eliminate inferred latches generated by case-statement and loop-statement conditional logic). In another embodiment, the HDL source code can include comments that enable/disable the inferred latch synthesis process 300 for specific portions of the code. If all inferred latches are to be ignored, the synthesis process 300 proceeds to step 322. Otherwise, the method proceeds to step 310.

At step 310, a node tree from 306 is scanned to identify conditional logic productions (CLPs) that create inferred latches. CLPs are the productions in the node tree that represent conditional logic statements in the HDL source code. In VHDL, for example, there are if-statement, case-statement, and loop-statement CLPs. The node tree is scanned from the innermost CLP to the outermost CLP in a recursive manner.

At step 312, the node tree is modified by automatically adding and/or modifying the CLPs that create inferred latches. As described more fully below, CLPs that create inferred latches are modified to include default assignments for signal variables such that an inferred latch is eliminated.

At optional step 314, a determination is made as to whether or not to warn the user regarding identified inferred latches. If warnings are to be issued, at step 316 warnings are appended to a log file created by the synthesis program. Warnings can be issued based on the command line parameters in step 304, or by the use of comments within the HDL source code itself.

At optional step 318, a determination is made as to whether or not to modify the HDL source code file to correct the code that generates an inferred latch. The user can choose whether or not to modify the HDL source file using the command line parameters in step 304. If the HDL source code is to be modified, it is modified at step 320. Otherwise, at step 322, synthesis process 300 is completed, and a netlist is generated. Synthesis process 300 ends at step 324.

Figure 4:
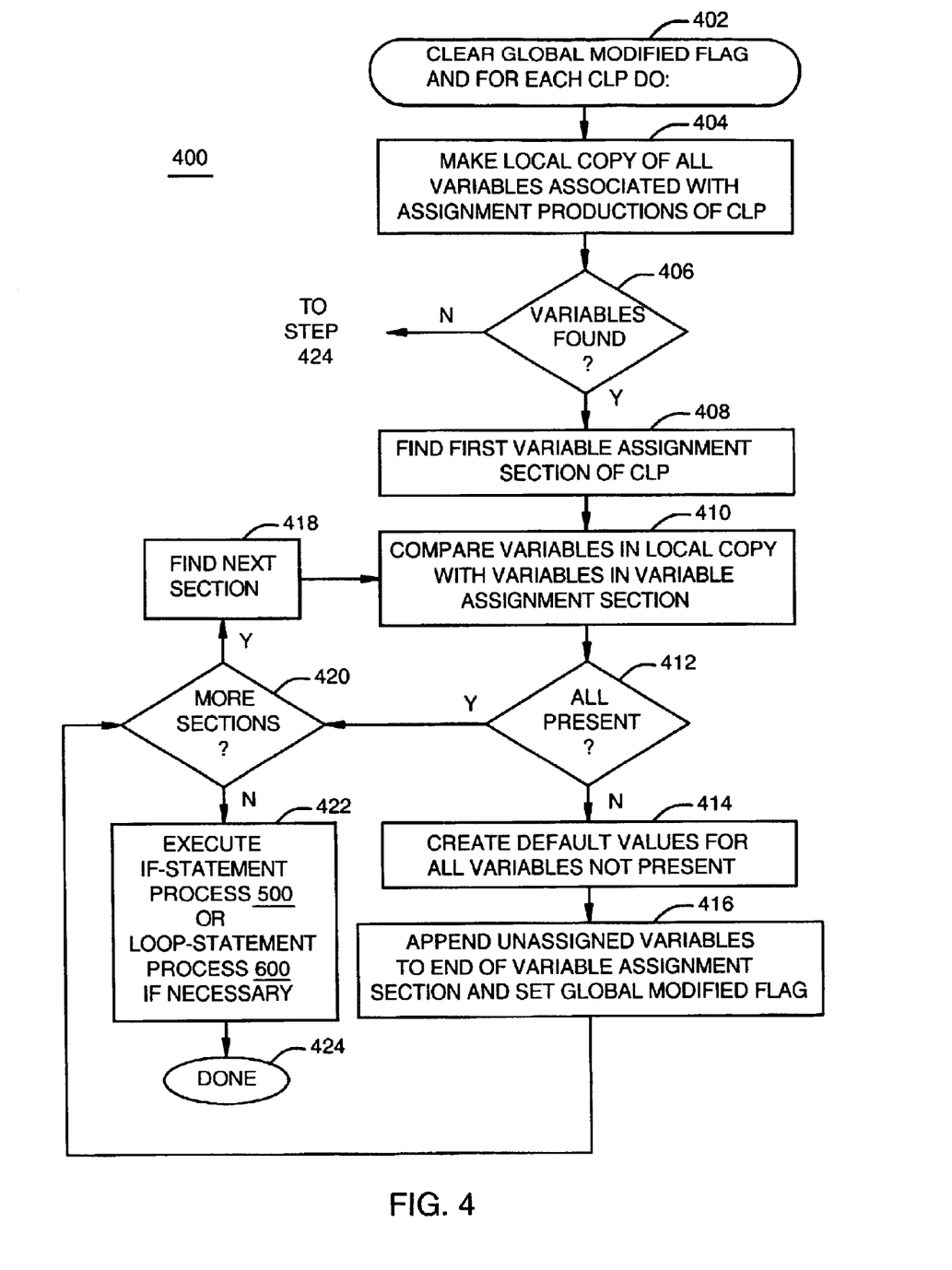
FIGS. 4–6 depict more detailed flow diagrams showing exemplary embodiments for automatically eliminating inferred latches given various conditional logic constructs in accordance with one or more aspects of the present invention.
Figure 5:
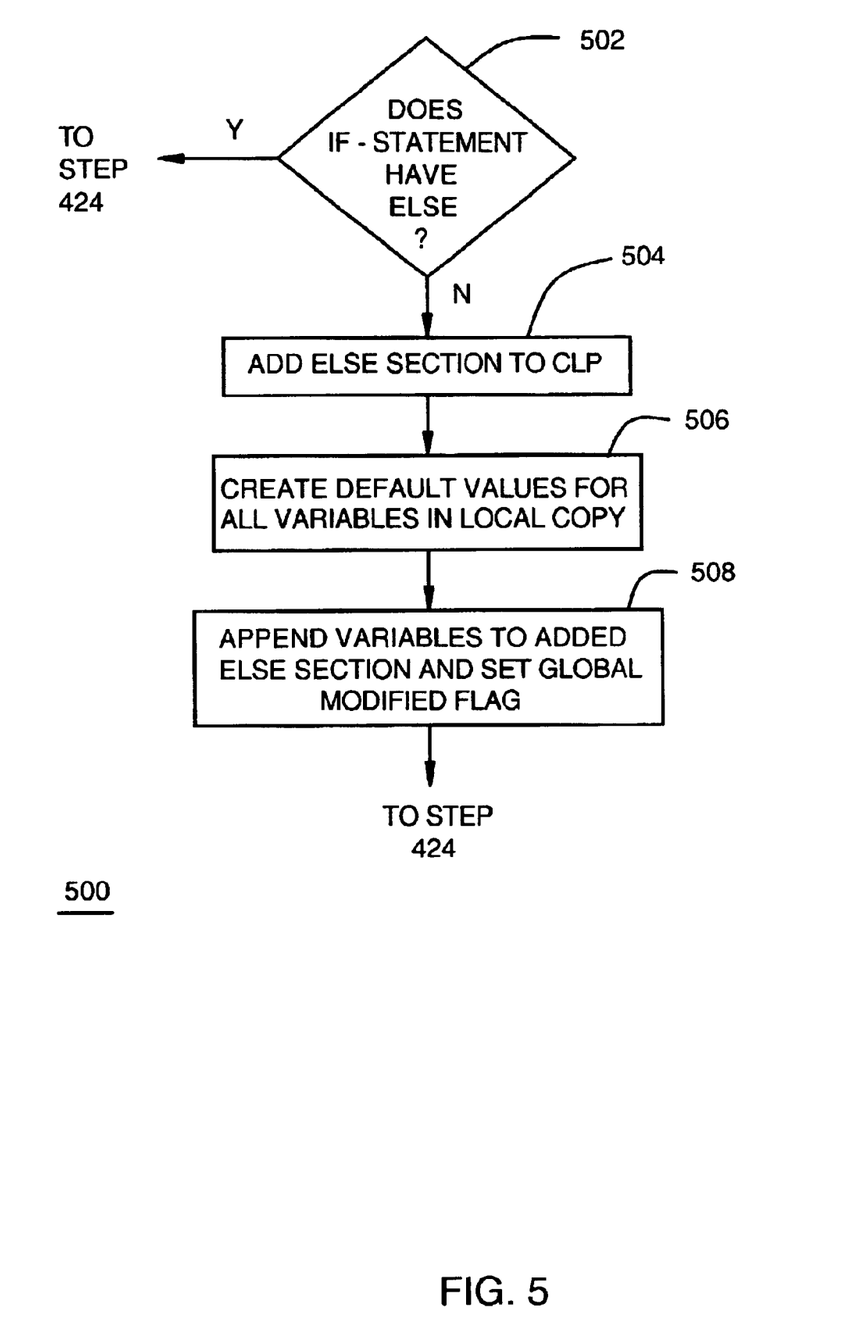
Figure 6:
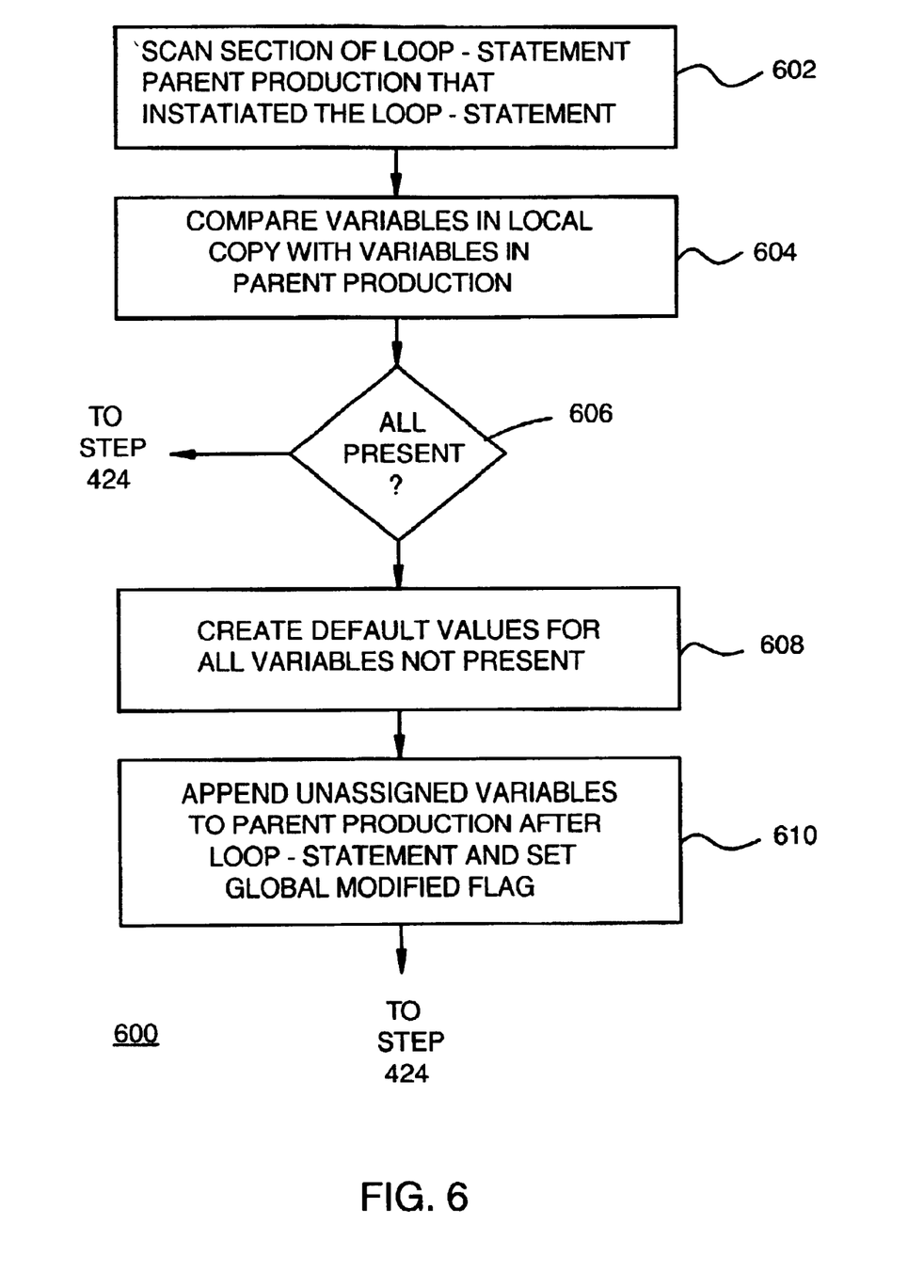

FIGS. 4–6 depict more detailed flow diagrams showing more exemplary embodiments for automatically eliminating inferred latches for various conditional logic constructs. Specifically, FIG. 4 depicts a flow diagram showing an inferred latch synthesis 400 for routine eliminating inferred latches for case-statement, if-statement, and loop-statement conditional logic constructs. FIG. 5 depicts a flow diagram showing an if-statement processing subroutine 500. FIG. 6 depicts a flow diagram showing a loop-statement processing subroutine 600.

As shown in FIG. 4, the method begins at step 402, where a global modified flag is cleared. The global modified flag is used to determine if the HDL source code should be modified (if the user desires to have the HDL source modified). Then for each CLP in the node tree, steps 404 through 424 are performed.

At step 404, a local copy is made of all variables (also referred to as signals) associated with assignment productions of the CLP. An assignment production is a sub-production of the CLP where signals are assigned the values of other signals or literal values. For example, in VHDL, signals are assigned values in "target", productions.

At step 406, a determination is made as to whether or not any variables associated with assignment productions were found. If the local copy contains variables, the method 400 proceeds to step 408. Otherwise, the method proceeds to end step 424.

At step 408, the first variable-assignment section of the CLP is found. A variable-assignment section is a section of sub-productions of the CLP having assignment productions (i.e., a section of sub-productions where variables can be assigned values). For example, in VHDL, such variable-assignment sections are known as "sequence_of_statements" sub-productions. A CLP may have one or more "sequence_of_statements" sub-productions depending on the specific conditional logic construct being implemented.

At step 410, the variables in the local copy are compared with the variables in the current variable-assignment section. That is, the current variable-assignment section is scanned to determine if all the variables present in the local copy are assigned values in the current variable-assignment section. At step 412, a determination is made as to whether all variables in the local copy are assigned values in the current variable-assignment section. If so, routine 400 proceeds to step 420. Otherwise, routine 400 proceeds to step 414.

At step 414, default values for all variables not assigned in the variable-assignment section are created. At step 416, unassigned variables (along with their default values) are appended to the end of the variable-assignment section and the global modified flag is set.

At step 420, a determination is made as to whether or not there are mode variable-assignment sections in the CLP. For example, in case-statements, there may be variable-assignment sections corresponding to each "case" section. In compound if-statements, there may be variable-assignment sections corresponding to each "if" and "else-of" section.

If there are more variable-assignment sections, routine 400 proceeds to step 418. At step 418, the next variable-assignment section is found and routine 400 proceeds to step 410. Otherwise, routine 400 proceeds to step 422. At step 422, specific if-statement and loop-statement processing is performed as described below if necessary. If the CLP is a case-statement, step 422 is not applicable, and the method ends at step 424.

In FIG. 5, if-statement processing begins at step 502, where a determination is made as to whether or not an if-statement CLP includes an "else" section. For example, in VHDL, an if-statement CLP contains an "else" section if the "if_has_else" sub-production is true. If there is an "else" section, the if-statement processing proceeds to end step 424. Otherwise, if-statement processing proceeds to step 504.

At step 504, an "else" section is added to the CLP. That is, sub-productions corresponding to an "else" section are appended to the CLP. At step 506, default values are created for all variables present in the local copy made in step 404. At step 508, the variables (along with their default values) are appended to the added "else" section and the global modified flag is set. If-statement processing completed, subroutine 500 returns proceeds to end step 424 for an if-statement.

In FIG. 6, loop-statement processing begins at step 602, where the section of the loop-statement parent production that instantiated a loop-statement is scanned. Within a loop-statement, there is no way to specify what happens when the loop is not true (i.e., there is no equivalent of the "else" section in an if-statement). Thus, the parent production that instantiated the loop-statement is scanned to determine whether the variables in the local copy created in step 404 are assigned values after the loop-statement.

At step 604, variables in the local copy are compared with variables in the parent production. At step 606, a determination is made as to whether or not all variables are present in the parent production. If all the variables in the local copy are assigned values in the parent production, then the loop-statement processing proceeds to end step 424. Otherwise, the loop-statement processing 600 proceeds to step 608.

At step 608, default values are created for all variables in the local copy that are not assigned values in the parent production. At step 610, unassigned variables are appended to the parent production after the loop-statement productions and the global modified flag is set. Loop-statement processing then proceeds to end step 424.

In order to better understand the present invention, examples of HDL code as processed in accordance with one or more aspects of the present invention are discussed. In the first example, a VHDL design that creates an inferred latch as a result of an incomplete if-statement is as follows:

entity ENT is
      port (A,B=in bit; C=out bit);
   end;

```
architecture ARCM of ENT is
    begin process (A, B)
        begin if A='1' then C <=B; end if;
    end process;
end;
```
The resulting node tree 700 for the HDL code in the present example is shown in FIG. 7.

Figure 8:
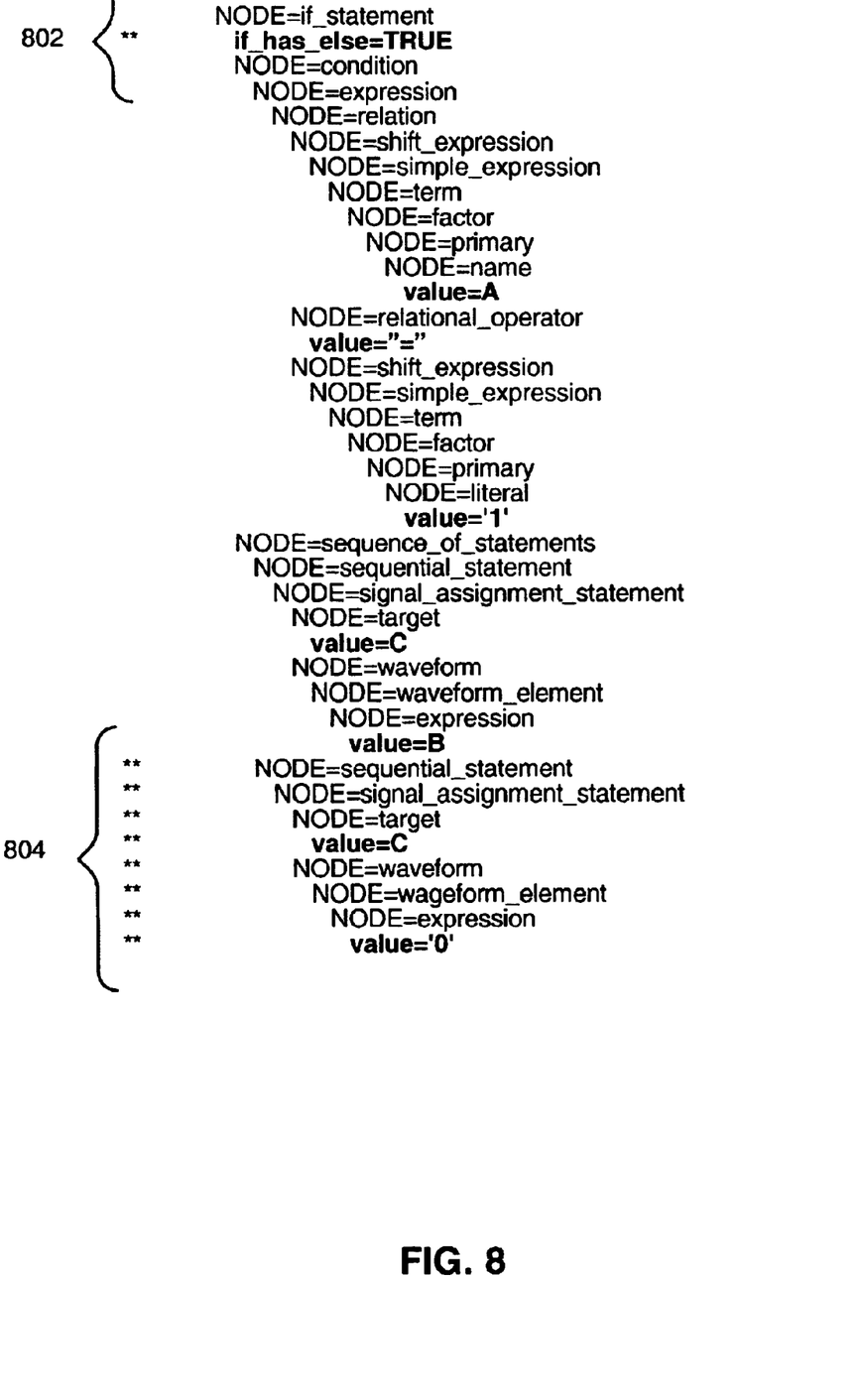
FIG. 8 illustrates the node tree of FIG. 7 modified in accordance with one or more aspects of the present invention.

FIG. 8 illustrates node tree 700 as modified in accordance with one or more aspects of the present invention the present invention. The node tree 700 is scanned for the lowest level CLP. An if-statement CLP is found by this scan. The CLP is scanned for "targets" (i.e., variables) and signal C is found by this scan. A local copy of targets is created, with signal C being the sole item in the list. The if-statement CLP is scanned for an "else" section, and in this example, none is found (i.e., if_has_else=FALSE). A new set of nodes is created to add the else section. Nodes for the default assignment of signal C are appended to the new "else" section. The added nodes are indicated by numeral 804. In addition, an "if_has_else" flag is set to TRUE, as indicated by numeral 802. The scan of node tree 700 completes, in this example, as no more CLPs are present in this design. The HDL source code is automatically modified as follows:

```
entity ENT is
    port (A,B =in bit; C =out bit);
end;
architecture ARCM of END is
    begin process (A, B)
        begin if A ='1' then C <=B;
        else C <='0' —Added else C <='0'
        end if;
    end process;
end;
```

In another example, HDL code having multi-level conditional logic is as follows:

```
if (J) then
    case I is
        when "00"=>A <="01";
        when "01"=>A <="10";
        when "10"=>
        when others =>A <="00";
    end case;
    B <=A;
end if;
```

The lowest level CLP is found, which is the case-statement. It is determined that for the condition I="10", signal A is not assigned. A default assignment is determined, and revises internal nodes of a resulting node tree to include the default assignment.

A next CLP is identified, which is an if-statement in this example. Assigned variables ("targets") are identified as signals A and B. Since the if-statement does not have an "else" section, an "else" section is added. Signals A and B are assigned default values in the added else section. If the HDL code is to be modified, the resulting code is as follows:

```
if (J) then
    case I is
        when "00"=>A <="01";
        when "01"=>A <="10";
        when "10"=>A <="00";
        when others =>A <="00";
    end case;
    B <=A;
else
    A <="00";
    B <="00";
end if;
```

While the foregoing is directed to the preferred embodiment of the present invention, other and further embodiments of the invention may be devised without departing from the basic scope thereof, and the scope thereof is determined by the claims that follow.

What is claimed is:

1. A method of automatically eliminating inferred latches created by hardware design language (HDL) source code, the method comprising:

building a node tree from the HDL source code;

scanning the node tree to identify one or more conditional logic productions (CLPS) that are sources for the inferred latches; and generating a modified node tree by performing at least one of adding and modifying sub-productions of the one or more CLPs to eliminate one or more of the inferred latches respectively associated therewith.

2. The method of claim 1, further comprising:

synthesizing the modified node tree to produce a netlist for realizing the HDL source code in hardware.

3. The method of claim 1, further comprising:

modifying the HDL source code in response to the modified node tree.

4. The method of claim 1, further comprising:

generating a log file containing warnings corresponding to the one or more CLPs that are sources for the inferred latches.

5. The method of claim 1, wherein the generating step further comprises:

selecting a CLP;

identifying one or more variables associated with a respective one or more assignment productions of the selected CLP;

scanning one or more variable-assignment sections of the selected CLP to identify which of the one or more variables are unassigned therein;

assigning default values to the one or more unassigned variables in each of the variable-assignment sections; and repeating steps (a) through (d) for each of the one or more CLPs identified.

6. The method of claim 5, wherein each of the one or more CLPs is selected from an if-statement, a case-statement, and a loop-statement.

7. The method of claim 6, further comprising:

when the CLP selected is an if-statement not having else, adding an else section to the if-statement; and assigning default values to each of the one or more variables in the else section added.

8. The method of claim 6, further comprising:

when the CLP selected is a loop-statement, scanning a parent production of the loop-statement to identify which of the one or more variables are unassigned variables therein; and assigning default values to the one or more unassigned variables in the parent production.

9. A computer readable medium having stored thereon instructions that, when executed by a processor, cause the processor to perform a method of automatically eliminating inferred latches created by hardware design language (HDL) source code, the method comprising:

building a node tree from the HDL source code;

scanning the node tree to identify one or more conditional logic productions (CLPs) that are sources for the inferred latches; and generating a modified node tree by automatically performing at least one of adding and modifying sub-productions of the CLPs to eliminate one or more of the inferred latches respectively associated therewith.

10. The computer readable medium of claim 9, further comprising:
synthesizing the modified node tree to produce a netlist for realizing the HDL source code in hardware.

11. The computer readable medium of claim 9, further comprising:
modifying the HDL source code in response to the modified node tree.

12. The computer readable medium of claim 9, further comprising:
generating a log file containing warnings corresponding to the one or more CLPs that are sources for the inferred latches.

13. The computer readable medium of claim 9, wherein the generating step further comprises:
selecting a CLP;
identifying one or more variables associated with a respective one or more assignment productions of the selected CLP;
scanning one or more variable-assignment sections of the selected CLP to identify which of the one or more variables are unassigned therein;
assigning default values to the one or more unassigned variables in each of the variable-assignment sections; and
repeating steps (a) through (d) for each of the one or more CLPs identified.

14. The computer readable medium of claim 13, wherein each of the one or more identified CLPs is selected from an if-statement, a case-statement, and a loop-statement.

15. The computer readable medium of claim 14, further comprising:
when the CLP selected is an if-statement not having else, adding an else section to the if-statement; and
assigning default values to each of the one or more variables in the else section added.

16. The computer readable medium of claim 14, further comprising:
when the CLP selected is a loop-statement, scanning a parent production of the loop-statement to identify which of the one or more variables are unassigned variables therein; and
assigning default values to the one or more unassigned variables in the parent production.

17. An apparatus for automatically eliminating inferred latches created by hardware design language (HDL) source code, the apparatus comprising:
means for building a node tree from the HDL source code;
means for scanning the node tree to identify one or more conditional logic productions (CLPs) that are sources of the inferred latches; and
means for generating a modified node tree by automatically performing at least one of adding and modifying sub-productions to eliminate one or more of the inferred latches respectively associated therewith.

18. The apparatus of claim 17, further comprising:
means for synthesizing the modified node tree to produce a netlist for realizing the HDL source code in hardware.

19. The apparatus of claim 17, further comprising:
means for modifying the HDL source code in response to the modified node tree.

20. The apparatus of claim 17, further comprising:
means for generating a log file containing warnings corresponding to the one or more CLPs that are sources for the inferred latches.

21. The apparatus of claim 17, wherein the generating means further comprises:
means for selecting a CLP;
means for identifying one or more variables associated with a respective one or more assignment productions of the selected CLP;
means for scanning one or more variable-assignment sections of the selected CLP to identify which of the one or more variables are unassigned therein; and
means for assigning default values to the one or more unassigned variables in each of the variable-assignment sections.

22. The apparatus of claim 21, wherein each identified CLP is selected from the group consisting of an if-statement, a case-statement, and a loop-statement.

23. The apparatus of claim 22, further comprising:
means for adding an else section to the if-statement when the CLP selected is an if-statement not having else; and
means for assigning default values to each of the one or more variables in the else section added.

24. The apparatus of claim 22, further comprising:
means for scanning a parent production of the loop-statement to identify which of the one or more variables are unassigned variables therein when the CLP selected is a loop-statement; and means for assigning default values to the one or more unassigned variables in the parent production.

* * * * *